United States Patent [19]

Magome et al.

[11] Patent Number: 5,289,231
[45] Date of Patent: Feb. 22, 1994

[54] APPARATUS FOR MANUFACTURING DISC MEDIUM

[75] Inventors: Nobutaka Magome, Kawasaki; Hiromitsu Iwata; Junichi Morino, both of Yokohama; Toru Kiuchi, Kurume, all of Japan

[73] Assignee: Nikon Corporation, Tokyo, Japan

[21] Appl. No.: 992,772

[22] Filed: Dec. 18, 1992

[30] Foreign Application Priority Data

Dec. 25, 1991 [JP] Japan .................. 3-343257

[51] Int. Cl.$^5$ .................................. G03B 27/42
[52] U.S. Cl. .................................. 355/53; 355/50
[58] Field of Search .................. 355/50, 53

[56] References Cited

U.S. PATENT DOCUMENTS

| 4,899,195 | 2/1990 | Gotoh | 355/534 |
| 4,910,549 | 3/1990 | Sugita | 355/53 |
| 5,028,955 | 7/1991 | Hayashida et al. | 355/53 |
| 5,168,021 | 12/1992 | Arai et al. | 430/22 |
| 5,168,304 | 12/1992 | Hattori | 355/50 |

FOREIGN PATENT DOCUMENTS 62-50811  4/1982  Japan .
62-217443 9/1987  Japan .

*Primary Examiner*—Richard A. Wintercorn
*Attorney, Agent, or Firm*—Shapiro and Shapiro

[57] ABSTRACT

This specification discloses a method of and an apparatus for manufacturing a disc medium which utilize the projection exposure technique of a stopper for lithography, rotate a circular photosensitive substrate which provides the disc medium at the same speed as a circular reticle having a pattern of information tracks while rotating the reticle, and irradiate the reticle with illuminating light of a slit-like shape or a sectoral shape extending in the diametrical direction of the circular reticle to thereby effect rotation scan exposure.

1 Claim, 10 Drawing Sheets

APPARATUS FOR MANUFACTURING DISC MEDIUM

BACKGROUND OF THE INVENTION

1. Field of the Invention

This invention relates to a method of and an apparatus for manufacturing a disk-like medium such as a compact disc (CD) or a video disc (VD), and particularly to a method of and an apparatus for manufacturing a pattern such as round tracks (grooves) formed on a disc medium by unevenness or information pits on the tracks, by the lithography technique.

2. Related Background Art

As a method of manufacturing a CD or a VD of this kind or the like, it has heretofore been practised to form pattern information which will provide grooves or pits on a master disc (mother) by direct cutting by the use of a laser spot, reproduce it as a replica onto an electrocasting stamper, and further make a CD or a VD which will be a product by stamping by the use of the electrocasting stamper.

In the presentday CD or VD, the line width of grooves or pits is about 1 $\mu$m, and even by the stamping method, pattern transfer can be accomplished sufficiently accurately, and throughput and cost reduction are also good.

Accordingly, in a CD or a VD, round tracks (grooves) on the disc are concentrically or spirally formed at a pitch of the order of 2 $\mu$m in the diametrical direction thereof.

However, if an attempt is made to make the information density per unit area on the disc higher than the existing one, there will arise the necessity of making the width of and the interval between the grooves or pits as minute as 0.5 $\mu$m–0.3 $\mu$m. Along therewith, the wavelength $\lambda$ of an information reading beam will be shortened. By shortening the wavelength $\lambda$ of the beam, it becomes possible to make the diameter of the spot applied onto the disc minute. Of course, the depth of the grooves or pits becomes smaller as the line width or the interval becomes more minute, because the optical distance (depth x refractive index) becomes ¼ of the wavelength $\lambda$ of the beam.

If the grooves or pits are thus made minute, there will arise the problem that accurate transfer by the existing stamper system becomes difficult. That is, the material forming the disc has more or less elasticity and therefore, there will arise the problem that transfer cannot be successfully accomplished even if an attempt is made to apply pressure to form the pattern of grooves or pits, because the grooves or pits are made too minute.

So, a method of and an apparatus for manufacturing a disc medium by the lithography technique has been proposed by Japanese Laid-Open Patent Application No. 62-217443. This known technique is to project the pattern of a disc medium formed on a photomask or a reticle onto a partial area of a disc substrate having photoresist applied thereto in advance and rotate this substrate continuously or intermittently to thereby expose the substrate and complete exposure by one full rotation of the substrate.

However, the above-mentioned publication has merely proposed a basic technique of manufacturing a disc medium by the use of the lithography technique, and various improvements therein have been necessary to complete it as an actually practical apparatus.

SUMMARY OF THE INVENTION

It is the object of the present invention to provide an improved method of and an improved apparatus for manufacturing a disc medium by the use of the lithography technique.

The manufacturing method of the present invention executes the following manufacturing steps (a)–(d):

(a) Forming on a circular transparent substrate a zonal original pattern area corresponding to the area of round tracks (grooves or pit rows) to be formed on a disc medium to thereby make a reticle (photomask) for lithography;

(b) Disposing the reticle with its zonal central point made eccentric with respect to the optical axis of a projection optical system so that a part of the original pattern area on the reticle may lie within the projection field area of the projection optical system over at least the entire width of the zone;

(c) Disposing a photosensitive disc which provides a disc medium on the image plane side of the projection optical system so that the central point of the photosensitive disc may be eccentric from the optical system of the projection optical system; and (d) Rotating the reticle with its zonal central point as the origin while applying illuminating light to the circular reticle, and also rotating the photosensitive disc at the same angular velocity as that of the reticle with the central point of the photosensitive disc as the origin.

By the above-described steps, the projected image of the zonal original pattern area is rotated, scanned and exposed on the photosensitive disc. Thereafter, although not directly concerned with the present invention, the development, etching, etc. of the photosensitive disc are effected, whereby an uneven round track pattern is formed on the disc.

Also, the present invention provides an exposure apparatus for executing the steps (b), (c) and (d) of the above-described form steps (a)–(d).

That is, the exposure apparatus of the present invention is provided with first rotatable holding means for rotatably holding a circular reticle having a zonal original pattern area on the object plane side of a projection optical system with the zonal central point as the origin, illuminating means for illuminating a part of the original pattern area of the reticle by illuminating light limited to a slit-like shape or a sectoral shape having the same degree of length as the diametrical width of the zone and extending diametrically of the zone, second rotatable holding means for rotating a photosensitive disc with its central point as the origin with the central point of the photosensitive disc disposed at a position substantially conjugate with the zonal central point of the reticle with respect to the projection optical system, drive control means for driving the first rotatable holding means and the second rotatable holding means so that the reticle and the photosensitive disc may be synchronously rotated at equal angular velocities, and illumination control means for controlling the illuminating light from the illuminating means so as to illuminate the reticle as long as the rotation of the reticle and the photosensitive disc takes place integer times when they are synchronously rotated.

In the method or apparatus of the present invention, as in the exposure method of the scan type used in the lithography processs, the reticle and the photosensitive disc are rotatively scanned during the exposing operation. So, the principle of the rotative scan exposure will hereinafter be described with reference to FIG. 1 of the accompanying drawings.

In FIG. 1, exposure light for illuminating a zonal original pattern area PA on a circular reticle R by a sectoral illuminating area IA is emitted from a condenser lens 1 constituting a portion of an illuminating system. The origin of this sectoral illuminating area IA is substantially coincident with the central point C1 of the zonal pattern area PA, i.e., the rotation center axis of the reticle R. A projection lens PL is for projecting the pattern image of a portion of the pattern area PA in the sectoral illuminating area IA onto a circular disc D having photosensitive resist applied thereto, and in FIG. 1, it has an optical axis AX coincident with the optical axis of the condenser lens 1 (illuminating system). In a projection lens by an ordinary refracting system, the pattern of the object plane side is projected as a reversed image (a mirror image) and therefore, the central point C2 of the disc D, i.e., the rotation center axis, lies on the opposite side of the central point C1 of the reticle R with the optical axis AX interposed therebetween. That is, the central points C1 and C2 are in conjugate relationship with respect to the projection lens.

Also, when the radius of the outermost periphery of the information tracks on the disc D when completed as a disc medium is Sw and the magnification of the projection lens PL is m (in the case of reduction projection, m being less than 1), the radius Sr of the outermost periphery of the zonal pattern area PA on the reticle R is in the relation that Sw=m·Sr. Now, the reticle R, the projection lens PL and the disc D are disposed as shown in FIG. 1, the reticle R is rotated clockwise by a rotative driving system RRC, and the disc D is rotated counter-clockwise by a rotative driving system DRC. At this time, the reticle R and the disc D are controlled by a main control system MCU so as to assume the same angular velocities. When the velocities become the same, the exposure light is applied into the sectoral illuminating area IA, and when the reticle R and the disc D are rotated integer times (including one time), the application of the exposure light is discontinued.

Thereby, the latent image of the whole of the zonal pattern area PA is transferred to the resist layer on the surface of the disc D, whereafter the disc D is developed and passed through the etching (or evaporating) step or the like, whereby minute unevenness forming round tracks (grooves or pit rows) is formed on the disc D.

As described above, the exposure onto the disc D is effected by rotational scanning and therefore, to increase the number of discs to be treated (the throughput), it is desirable that the exposure be completed by one full rotation of the reticle R. Also, the sectoral illuminating area IA must be of a size which can be included in the circular field area on the object plane side of the projection lens PL.

Further, a one-side or both-side telecentric projection lens of high numerical aperture (high N.A.) and high resolving power used in a projection exposure apparatus (stepper) for the manufacture of semiconductive elements (super LSIs) can be intactly utilized as the projection lens PL of this kind, and resolves a line width of the order of 0.4–0.3 $\mu$m on the disc D.

Also, as the source of the exposure light, utilization can be made of a mercury discharge lamp including the spectrum of i line (or g line), an excimer laser having an oscillation spectrum in the ultraviolet range, or the like, and a minute line width is resolved by shortening the wavelength of the exposure light. Further, by devising the construction of the illuminating system with the shortening of the wavelength of the illuminating light, the resolution and the depth of focus of the projected image can be improved. Alternatively, a reticle provided with a phase member may be used so that the phase shift method may be applied to the round tracks in the pattern area PA of the reticle R or the reticle pattern corresponding to the pits in the tracks.

According to the present invention, disc mediums made high in density and minute can be manufactured precisely at a high throughput.

Further, according to the present invention, a slit-like or sectoral illuminating area is set on a circular mask substrate, and the illuminating area is of such dimensions as covers the entire area in the diametrical direction of the zonal pattern area on the mask substrate and therefore, the mask substrate and the photosensitive disc for a disc are capable of pattern exposure by only one full rotation at the minimum.

DETAILED DESCRIPTION OF THE PREFERRED EMBODIMENTS

Figure 1:
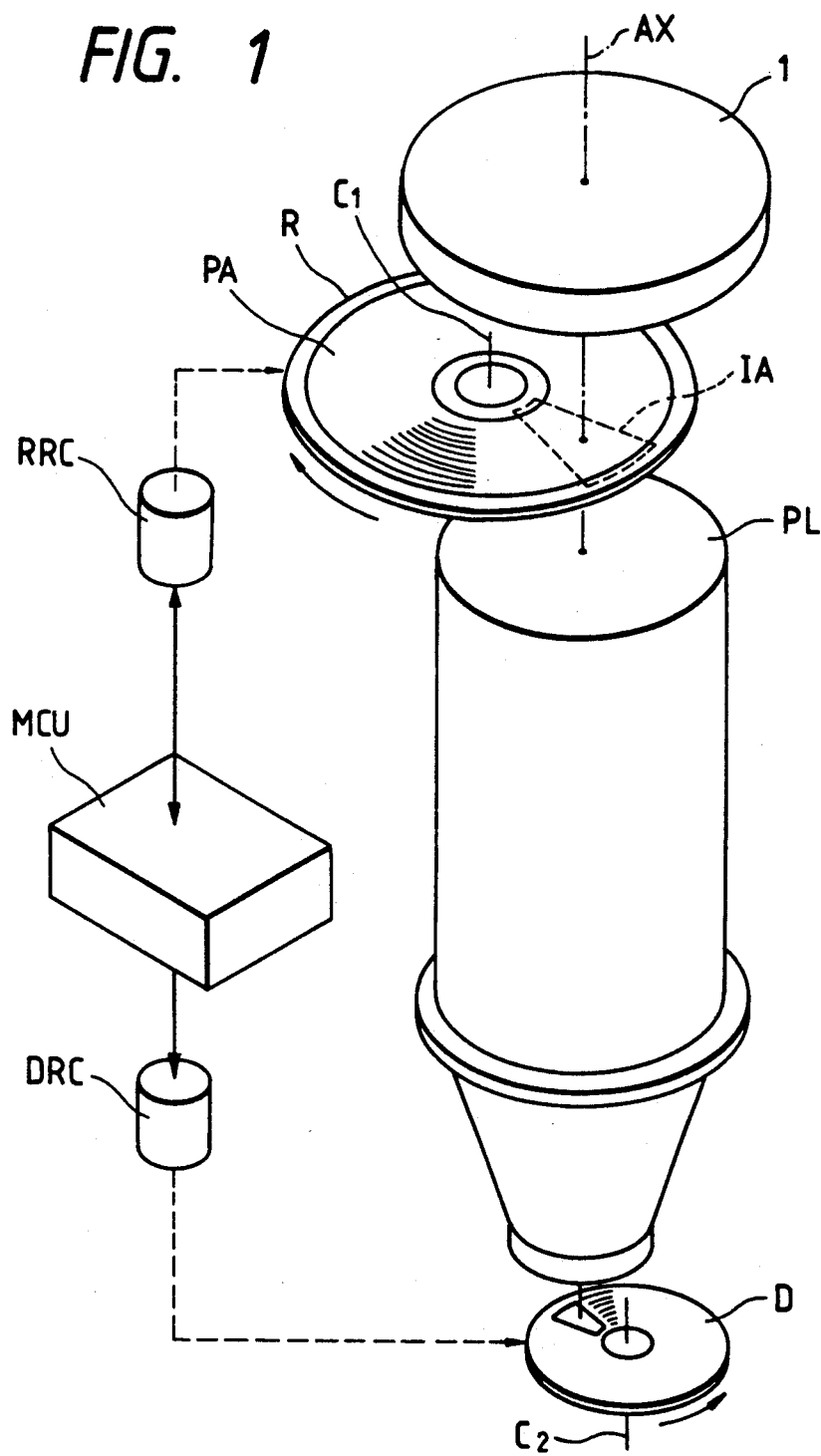
FIG. 1 is a perspective view schematically showing the principle of the construction of a rotation scanning exposure apparatus.
Figure 2:
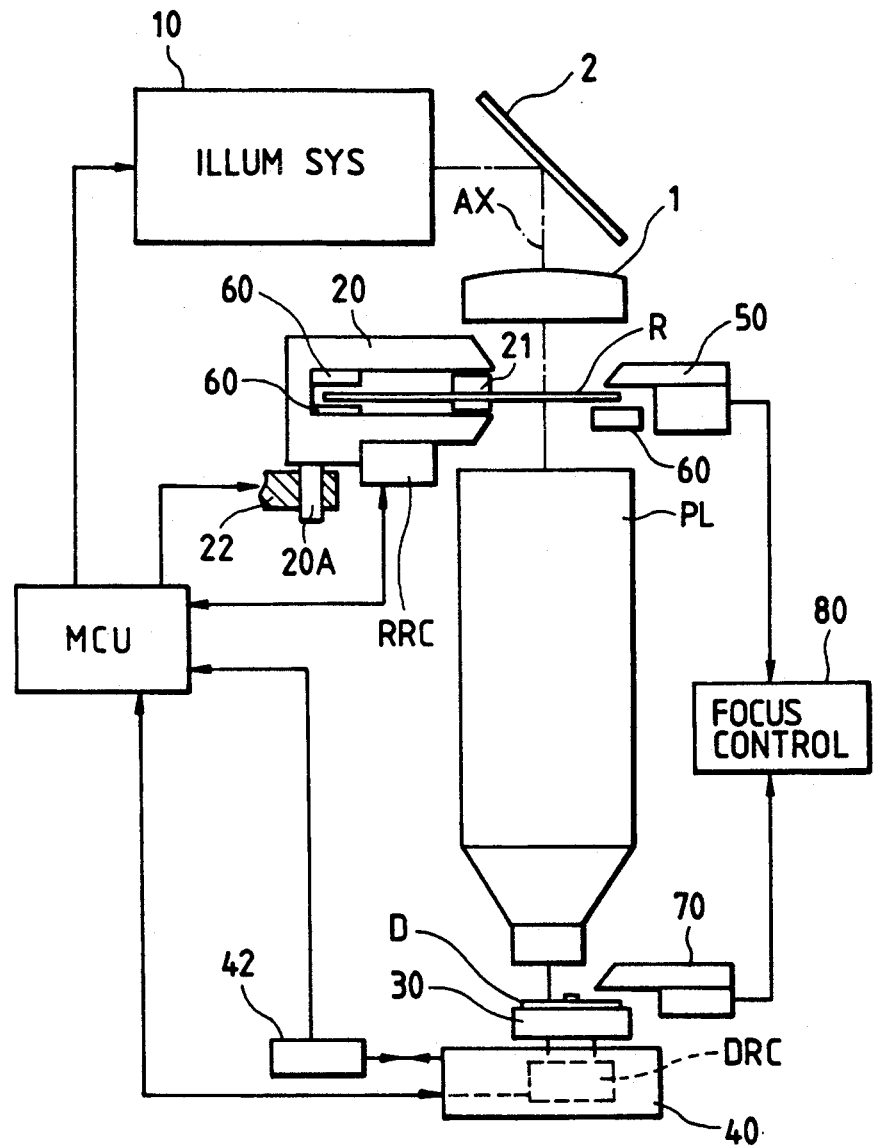
FIG. 2 shows the construction of the rotation scanning exposure apparatus.

The construction of a disc exposure apparatus according to an embodiment of the present invention will hereinafter be described with reference to FIGS. 2 to 5. Referring to FIG. 2 which shows the general construction of the disc exposure apparatus, exposure light from an illuminating system including a light source is reflected by a mirror 2, passes through the same condenser lens 1 as that shown in FIG. 1 and sectorally illuminates the zonal pattern area PA of a circular reticle R. A circular opening for bearing having a central point C1 as its center is formed in the central portion of the circular reticle R, and the rotary shaft 21 of a reticle rotating support mechanism 20 is engaged with this circular opening. The support mechanism 20 is provided with a rotatively driving system RRC for rotating the reticle R. The support mechanism 20 is rotatably provided on a sub-column 22 by means of a shaft 20A, and removes the reticle R out of a projection optical path during the interchange of the reticle R. The sub-column 22 is provided for fine movement in a horizontal direction relative to a main column holding a projection lens PL, by a motor, a piezo element or the like, and the movement thereof is effected by a command from a main control system MCU. This is for accurately aligning a sectoral illuminating area IA by the illuminating system and the zonal pattern area PA of the reticle R with each other.

On the other hand, an opening portion for bearing is formed in the central portion of a disc D which provides a disc medium, and the disc D is fixed on a rotatable table 30 provided with a pivot-like central projection engaged with this opening portion, as by vacuum adsorption. The table 30 is rotated by a driving system DRC, and the table 30 and the driving system DRC are provided on a horizontally movable XY stage 40, and the amount of movement thereof is detected by a length measuring machine 42 such as a laser interferometer. The reason why the length measuring machine 42 is thus provided is that during the interchange of the disc D, it is necessary to retract the rotatable table 30 from just beneath the projection lens PL and interchange an exposed disc with an untreated disc, and further that after the interchange, it is necessary to return the XY stage 40 accurately to the original exposure position. The measured value by the length measuring machine 42 is sent to the main control system MCU and is used for the control of a motor or the like for positioning the XY stage 40.

Further, in the present embodiment provision is made of a sensor 50 for detecting the parallelism (the perpendicularlity to the optical axis AX) of the reticle during its rotation, and a levelling mechanism 60 of the air bearing type or the like for regulating the parallelism of the reticle during its rotation, and provision is likewise made of a sensor 70 for detecting the parallelism of the disc D. Detection signals from these sensors 50 and 70 are sent to a focus control system 80 and are used for the control of a mechanism for finely moving the levelling mechanism 60 and the rotatable table 30 in the direction of the optical axis AX for focusing.

Figure 3:
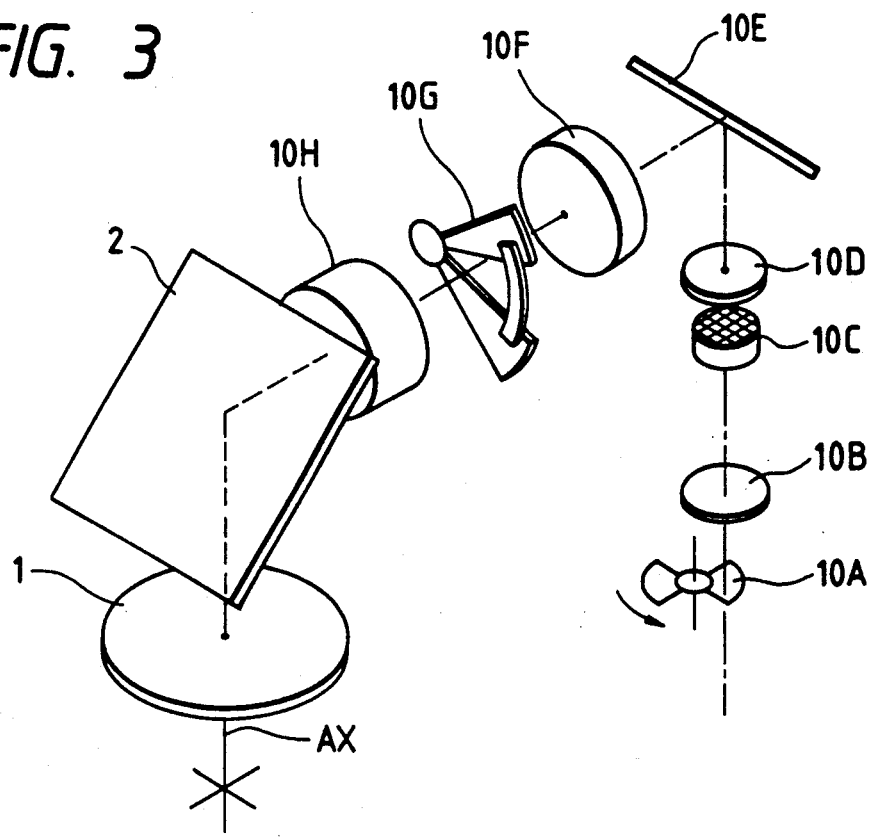
FIG. 3 is a perspective view showing the construction of an illuminating system.

Referring now to FIG. 3 which shows an example of the construction of the illuminating system, the illuminating light for exposure from the light source is condensed at the position of a rotary shutter 10A, whereafter it diverges and passes through a collimator lens 10B, thus becoming a substantially parallel light beam. Thereafter, the illuminating light beam enters a fly-eye lens 10C, and a plurality of secondary light source images are formed on the exit side of the fly-eye lens 10C. The light beams from the respective secondary light source image enter a first imaging lens 10F via a field lens 10D and a mirror 10E, and are superposed one upon another in the surface of a reticle blind (illuminating field stop) 10G. Thereby, a uniform illumination distribution is obtained on the blind 10G. The stop opening of the reticle blind 10G is of a sectoral shape in order to make the illuminating area IA on the reticle R sectoral, and has a movable blade so as to make the opening angle of the sector variable.

The illuminating light passed through the blind 10G enters the mirror 2 and the condenser lens 1 through a second imaging lens 10H and arrives at the reticle R. At this time, the pattern surface side of the reticle R (in FIG. 2, the underside of the reticle R) and the reticle blind 10G are in an imaging relation with each other.

In the present embodiment, the fly-eye lens 10C is disposed rearwardly of the shutter 10A and therefore, when the blades of the shutter 10A intercept a part of the illuminating light beam, the illumination distribution in the sectoral illuminating area IA is maintained uniform and only the average illumination thereof is reduced. Also, in the present embodiment, it is necessary to synchronize the opening-closing timing of the shutter 10A and the rotation angle positions of the reticle R and the disc D with one another and therefore, the time characteristic of the illumination change on the reticle during the opening operation or the closing operation of the shutter 10C is checked up in advance.

Figure 4:
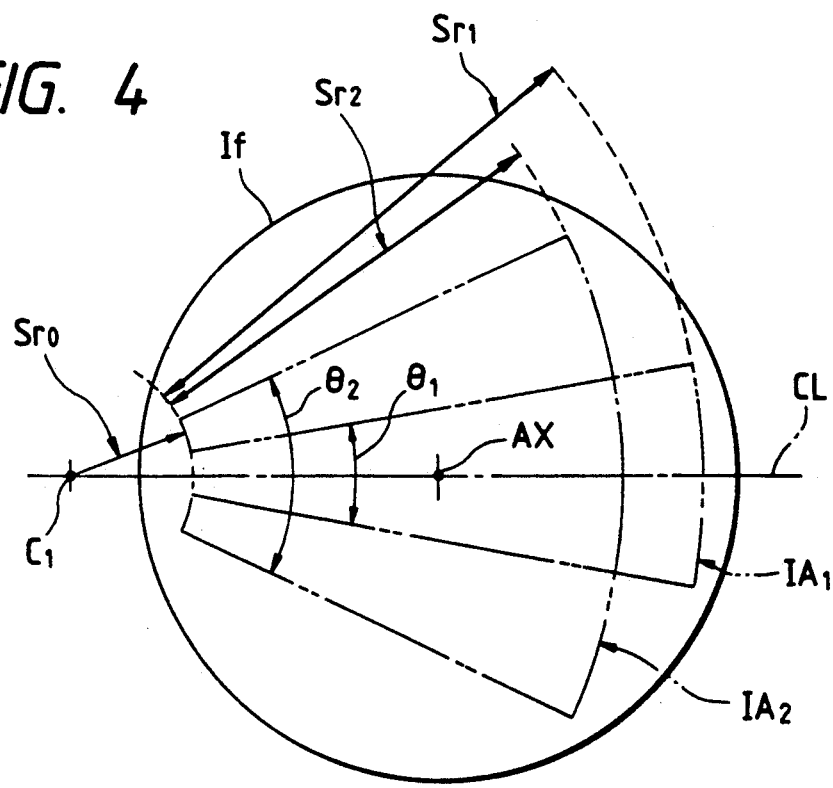
FIG. 4 is a plan view showing the relation between a sectoral illuminating area and a projection field.

FIG. 4 shows the relation between the circular field area If of the projection lens PL as it is seen from the reticle R side (the object plane side) and sectoral illuminating areas $IA_1$, $IA_2$. The sectoral illuminating area $IA_1$, represents a case where the opening angle $\theta_1$ thereof is relatively narrow, and the sectoral illuminating area $IA_2$ represents a case where the opening angle $\theta_2$ thereof is relatively wide, and the center positions of the respective opening angles are coincident with the rotation center point $C_1$ of the reticle R. In the present embodiment, the movable blade of the reticle blind 10G is moved so that a segment CL linking the center point $C_1$ and the optical axis AX together may be a symmetry axis.

In the case of the illuminating area $IA_1$, the zonal width of the zonal pattern area which can be illuminated is $S_{r1}$, and the maximum diameter of the reticle is $S_{r0}+S_{r1}$, where the radius $S_{r0}$ is the inner diameter of the zonal pattern area PA. The disc medium usually has a predetermined dimensional standard and therefore, the dimensions of the reticle and the outermost diameter of the zonal pattern area PA are also primarily determined. Accordingly, when the outermost diameter of the pattern area PA is $S_{r0}+S_{r1}$, the opening angle $\theta_1$ of the sectoral illuminating area IA included in the field area If cannot be made greater than the state shown in FIG. 4, and can only be made smaller than the opening angle $\theta_1$.

However, when like the sectoral illuminating area $IA_2$ of FIG. 4, the outermost diameter of the pattern area PA to be illuminated is $S_{r0}+S_{r2}$, the opening angle $\theta_2$ is substantially maximum and the illuminating area in the circumferential direction of the zonal pattern area PA is correspondingly enlarged. Accordingly, as compared with the rotation scanning exposure effected in the illuminating area $IA_1$, the rotation scanning exposure effected in the illuminating area $IA_2$ is advantageous in terms of throughput in that the scanning speed can be enhanced. Of course, in the present embodiment, the opening angle can be suitably regulated by the reticle blind 10G and therefore is set to an optimum opening angle in conformity with the rotational speeds of the reticle R and disc D, the illumination of the illuminating light and the sensitivity of the resist.

Also, in the present embodiment, the illuminating area IA of the reticle may be made into a straight slit-like shape extending on a segment CL in FIG. 4. In that case, however, it becomes difficult to make the width of the slit-like illuminating area extremely great. It is because the angular velocity is constant but the peripheral velocities differ between the outermost portion and the innermost portion of the pattern area PA and thus, the time during which the slit-like illuminating area is crossed differs between the outside and the inside of the pattern area PA and the exposure amount obtained on the disc D becomes non-uniform in the diametrical direction. Accordingly, where the illuminating area is made into a slit-like shape, the blind must be set within a range in which the slit width is not made very great. However, when it is necessary to change the exposure amount distribution in the diametrical direction on purpose, the approximation to a slit-like shape is better than a sectoral shape.

However, when it is unavoidable to adopt a slit-like illuminating area of relatively great width and it is desired to make the exposure amount distribution uniform, if a light decreasing filter of which the transmittance varies continuously or stepwise with respect to the lengthwise direction of the slit is provided near the blind and the uniformity of the illumination in the slit-like illuminating area in the lengthwise direction thereof is varied on purpose, the exposure amount distribution on the disc D in the diametrical direction thereof can be uniformized.

Also, the uniformity of the exposure amount distribution in the circumferential direction is determined by the stability of the speeds of the synchronous rotations of the reticle R and disc D, and the control thereof can be realized very easily. However, if the shutter 10A is opened to permit the application of the illuminating light as long as the reticle is rotated a random number of times, e.g. 1.5 times, relative to the illuminating area IA, the exposure amount will become about double over an area on the disc D corresponding to about 0.5 rotation, i.e., hemicycle. Assuming that with throughput first taken into account, the reticle R and disc D are exposed by one full rotation, when the shutter 10A is opened at a certain timing during the synchronous rotation to start exposure, it is necessary to synchronize the opening-closing timing of the shutter 10A so that the shutter 10A may be closed to complete exposure at a point of time whereat the reticle and disc have effected exactly one full rotation (360°).

Figure 5:
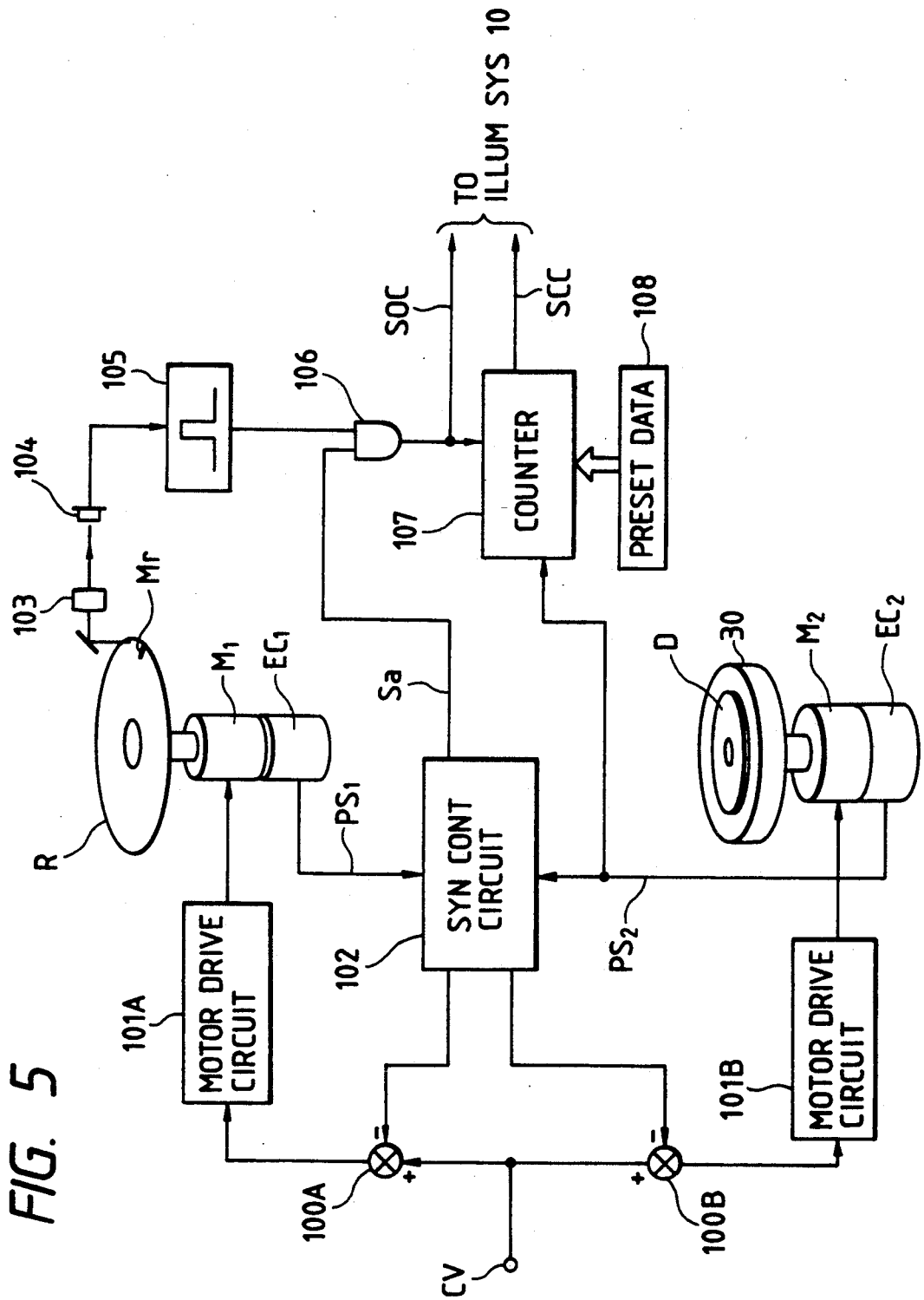
FIG. 5 is a block diagram showing the construction of a control system.

So, a specific example of the construction for the control thereof will hereinafter be described with reference to FIG. 5. In FIG. 5, rotary encoders EC1 and EC2 of high resolving power (which may preferably be identical to each other) are coupled to the shafts of a reticle rotating motor (preferably a brushless DC motor, an ultrasonic motor or the like) M1 and a motor M2 for rotating the table 30 on which the disc D is placed (the motor M2 may preferably be the same as the motor M1), respectively. The rotary encoders EC1 and EC2 may preferably be the same. In the present embodiment, the inertia of members (reticle R, bearing 21, etc.) which are the load of the shaft of the motor M1 and the inertia of members (disc D, tale 30, etc.) which are the load of the shaft of the motor M2 are made coincident with each other to the utmost in order to make the rotation irregularity characteristics of the reticle and disc even.

The motor M1 and encoder EC1 correspond to the drive control system RRC of FIG. 2, and the motor M2 and encoder EC2 correspond to the drive control system DRC. Also, in the main control system MCU, there is a portion which produces a command value CV for a synchronizing speed, and this command value CV is applied to motor drive circuits (servo circuits) 101A and 101B through differential calculators 100A and 100B, respectively. A deviation signal from a synchronization control circuit 102 is applied to each of the feedback inputs of the differential calculators 100A and 100B. This deviation signal assumes the same value as the command value CV when the motor M1 or M2 reaches the synchronizing speed. A pulse signal PS1 from the encoder EC1 and a pulse signal PS2 from the encoder EC2 are input to the synchronization control circuit 102, and the transition of the phase difference between the two pulse signals PS1 and PS2 with time is detected at a high resolving power, and when the transition of the phase difference becomes stable at approximately zero, a synchronization completing signal Sa is reversed to logic "1".

In the synchronization control circuit 102, there are provided a circuit for producing a deviation signal whose level varies in conformity with the frequency of the pulse signal PS1 from the encoder EC1 and applying it to the differential calculator 100A, and a circuit for producing a deviation signal whose level varies in conformity with the frequency of the pulse signal PS2 from the encoder EC2 and applying it to the differential calculator 100B.

Although not shown in FIG. 2, a mark Mr for timing is formed at one location on the marginal edge of the reticle R, and provision is made of a timing detecting mechanism for detecting this mark by a photoelectric sensor 104 through an objective lens 103 and making the photoelectric signal of the sensor 104 into a single pulse (spike pulse) by a waveform processing circuit 105. However, where the mark Mr cannot be formed on the marginal edge of the reticle, a mark equal thereto may be formed at one location on the marginal edge of the table 30 of the disc D and this mark may be photoelectrically detected.

The timing pulse from the processing circuit 105 is input to an AND gate 106 with a synchronization completion signal Sa, and the AND gate 106 outputs a start pulse SOC to a counter 107 only when it receives the timing pulse in a state in which the completion signal Sa is "1". This counter 107 is loaded with data pre-stored in a preset data latch portion 108, and in response to the start pulse SOC, the counter 107 down-counts the pulse signal PS2 from the encoder EC2. When the count value becomes zero (or a predetermined value), the counter 107 output a stop pulse SCC. The start pulse SOC and the stop pulse SCC are sent to a driving system for the shutter 10A which is provided in the illuminating system 10. The shutter 10A starts its opening operation in response to the start pulse SOC, and starts its closing operation in response to the stop pulse SCC.

Figure 6:
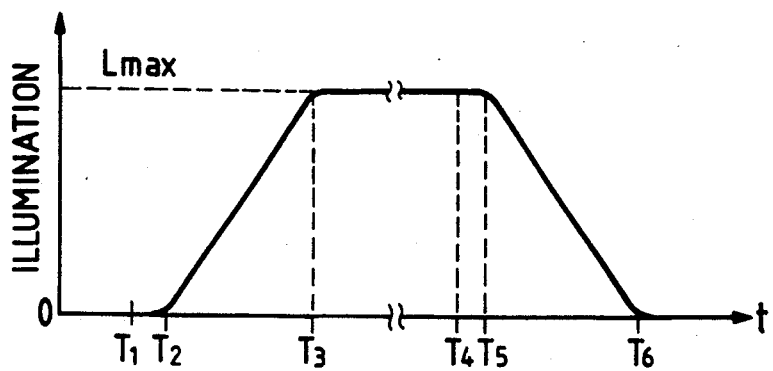
FIG. 6 is a graph showing variations with time in the image plane illumination obtained by one exposure.

FIG. 6 shows an example of the characteristic of variations in the illumination on the disc D caused by the opening and closing of the shutter 10A. In FIG. 6, the abscissa represents time t and the ordinate represents the illumination level obtained in the sectoral illuminating area of the disc D when the reticle is absent. Assuming that the start pulse SOC has been generated at time T1, the illumination increases from zero at a substantially constant gradient at time T2 delayed by an amount conforming to the mechanical response delay of the shutter 10A, the response delay of the electric circuit system, etc., and at time T3, the shutter 10A becomes fully open and the illumination reaches a maximum value Lmax. When thereafter, the stop pulse SCC is generated at time T4 with the shutter 10A fully open, the illumination decreases from Lmax at a substantially constant gradient at time T5 delayed by a predetermined amount, and becomes perfectly zero at time T6. In the present embodiment, it is to be understood that (T3−T2)=(T6−T5). Such an illumination characteristic can be readily specified by fixing a photoelectric sensor on the XY stage 40 in FIG. 2, digitally sampling the variation in the level of the photoelectric signal thereof by a clock pulse of a predetermined frequency, storing it in a memory and analyzing it.

In the present embodiment, those portions of the variation in the illumination which have constant gradients during the opening operation and the closing operation of the shutter 10A are overlapped with each other at a particular angular position during one full rotation of the disc D, thereby achieving the uniformization of the exposure amount in the circumferential direction.

Figure 7:
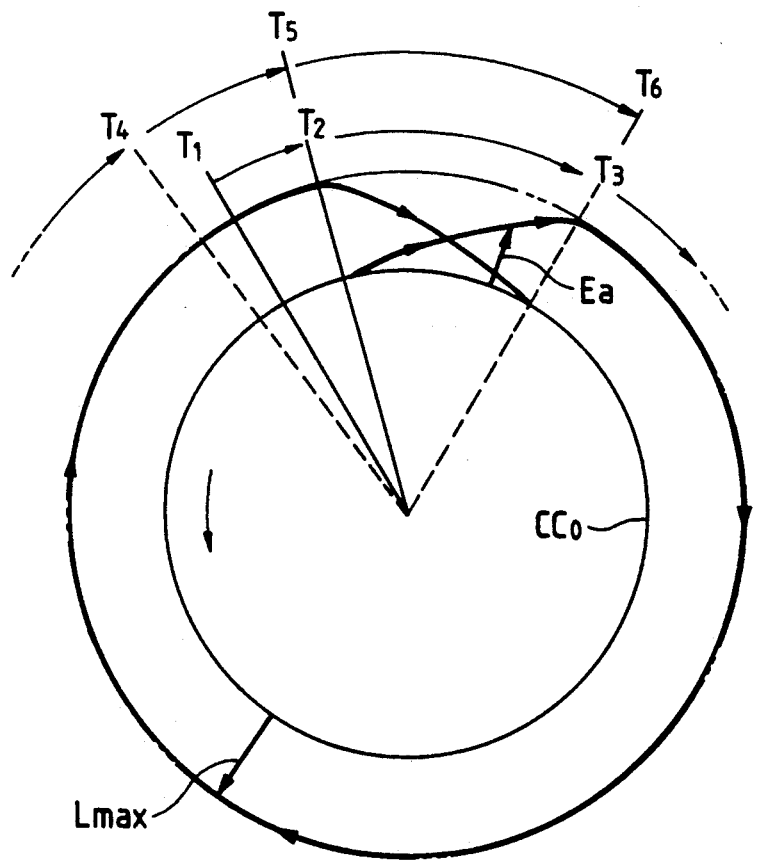
FIG. 7 is a graph schematically showing variations in the exposure amount during rotation scan exposure.

Referring to FIG. 7 which schematically represents the variation in the exposure amount during one full rotation given to the disc D, a circle CCo means that the exposure amount is zero, and an arrow Ea radially extending from the circle CCo represents the exposure amount (the maximum value of which is Lmax) at the rotation angle position thereof. Also, the rotation angle position of the circle CCo primarily corresponds to time and therefore, in FIG. 7, angle is represented by time to make the correspondence to FIG. 6 easy.

Assuming that the disc D is rotating counterclockwise, the direction in which the exposure amount is given on the disc D is relatively clockwise. When the start pulse SOC is generated at time T1, the exposure amount Ea increases at time T2 when the disc D has been rotated by a minute amount, and the exposure amount Ea reaches Lmax at time T3, whereafter the rotation progresses in that state. The stop pulse SCC is generated at time T4 immediately before one full rotation is reached, and the exposure amount decreases at time T5, and becomes completely zero at time T6.

As can be seen from FIG. 7, in the present embodiment, the timing of the generation of the stop pulse SCC is controlled so as to make the angular position at time T2 in the illumination characteristic (FIG. 6) and the angular position at time T5 in the illumination characteristic coincident with each other to the utmost. For this purpose, for example the pulse number of a pulse signal PS2 generated while the table 30 is rotated counter-clockwise from the angular position at time T1 in FIG. 7 to the angular position at time T4 is set in the preset data latch position 108. If this is done, the non-uniformity of the exposure amount given between time T2 and time T3 in FIG. 7 is compensated for by a variation in the exposure amount of the opposite characteristic given between time T5 and time T6, and a uniform exposure amount is obtained over the entire periphery of the disc D.

In the present embodiment, scan exposure is started by the timing detecting mechanism including the mark Mr, the objective lens 103 and the photoelectric sensor 104 of FIG. 5, with the angular position of the mark Mr of the reticle as the reference, whereas this is not always necessary, but provision may be made of an edge trigger circuit which generates a spike pulse when the synchronization completion signal Sa has risen to "1", and the spike pulse may be used as the start pulse SOC.

Also, in the example shown in FIG. 7, the response delay time (T2−T1) during the opening of the shutter and the response delay time (T5−T4) during the closing of the shutter differ from each other, but where those delay times can be made substantially coincident with each other, the mark Mr may be detected at first after a synchronous state is assumed, and the start pulse SOC may be output in response to a pulse generated from the timing detecting mechanism, and the stop pulse SOC may be output in response to the next pulse generated from the timing detecting mechanism after one full rotation of the reticle. In that case, the counter 107 and data latch portion 108 in FIG. 5 become unnecessary.

Further, in FIG. 7, the command value CV for the synchronizing speed is set so that proper exposure may be obtained by only one full rotation, but alternatively, design may be made such that a proper exposure amount may be obtained by the sum total of two or three full rotations. Again in that case, the link control of the exposure amount is effected just in the same manner as described in connection with FIG. 7.

Now, the above-described control system is suitable for an apparatus having a light source like a mercury lamp which continuously generates illuminating light at predetermined intensity, but it is difficult for such control system to be intactly applied to an apparatus having a light source like an excimer laser which effects pulse oscillation. So, a modification of the rotation scanning exposure when an excimer laser is used will hereinafter be described with reference to FIG. 8.

Figure 8:
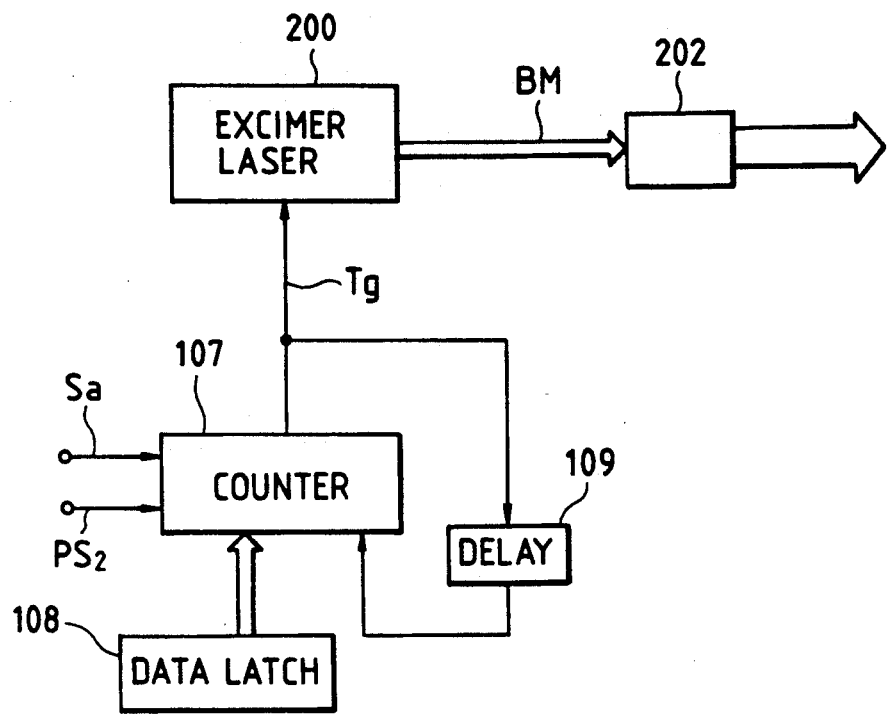
FIG. 8 is a block diagram showing a modification of the control system in the case of laser exposure.

In FIG. 8, a beam BM emitted from an excimer laser 200 is formed into parallel light of a predetermined cross-sectional shape through a beam expander 202 or the like, and enters the fly-eye lens 10C shown in FIG. 3. The counter 107 downcounts the pulse signal PS2 of the encoder EC2 (or the pulse signal PS1 of the encoder EC1) from a point of time at which the synchronization completion signal Sa has become "1". The pulse number of the pulse signal PS2 corresponding to the opening angle $\theta_1$ or $\theta_2$ of the predetermined amount of rotation of the reticle R and the disc D (here, the sectoral illuminating area $IA_1$ or $IA_2$ prescribed by the reticle blind) is preset in the data latch portion 108. When the count value of the counter 107 becomes zero, a trigger pulse Tg is sent to the excimer laser 200, which thus effects the oscillation of one pulse. Further, the trigger pulse Tg is applied as the present command of the counter 107 through a delay circuit 109 of a minute time (several to several tens of microseconds). Therefore, the counter 107 generates the trigger pulse Tg each time the reticle is rotated by the opening angle $\theta$ of the illuminating area IA, and performs the presetting operation at the same time.

Also, if because of pulse exposure, the shadow of the blind edge extending in the radial direction which prescribes the angle at which the sectoral illuminating area IA opens is sharp, the exposure amount in the boundary portion between two continuous pulse exposures becomes double or becomes entirely zero.

Figure 9:
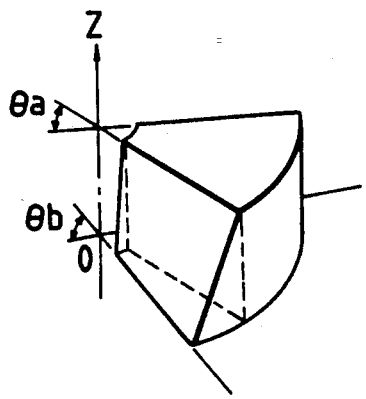
FIG. 9 is a perspective view three-dimensionally representing an example of the characteristic of sectoral illumination distribution.

So, the illumination distribution characteristic of the sectoral illuminating area IA on the reticle is made into such a distribution at shown in FIG. 9 wherein the illumination at the edge prescribing the opening angle is uniformly reduced in the circumferential direction. In FIG. 9, the vertical axis Z represents illumination, and when the sectoral opening angle on the bottom surface on which the illumination becomes zero is $\theta_b$ and the sectoral opening angle $\theta_a$ on the upper surface on which the illumination becomes Lmax is $\theta_a$, these are set to $\theta_a < \theta_b$, and also the amounts of variation in the illumination (the gradients of the illumination) on both sides which prescribe the opening angle are set equally. That is, in the three-dimensional illumination distribution of FIG. 9, surfaces (cylindrical surfaces) created by cutting that distribution in Z direction at any radius about the axis Z are all of similar trapezoidal shapes.

Figure 10:
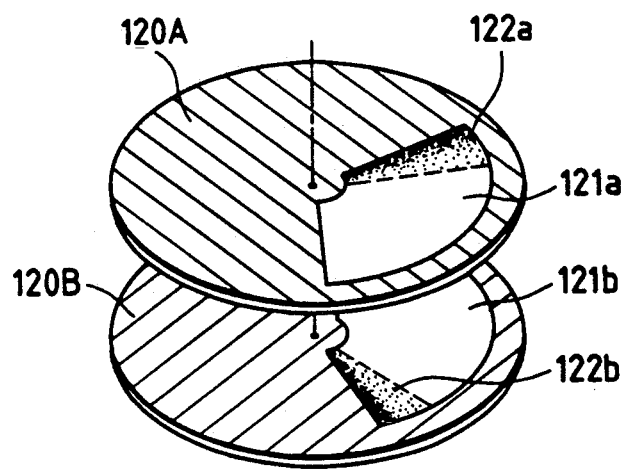
FIG. 10 is a perspective view showing the construction of a filter provided in the illuminating system.

In order to realize such an illumination distribution, two coaxial sectoral aperture discs 120A and 120B with a variable ND filter as shown in FIG. 10 are provided n lieu of the reticle blind 10G of FIG. 3. The aperture disc 120A is formed with a sectoral transparent opening portion 121a of dimensions which prescribe the radial width of the illuminating area IA, and in one edge portion which prescribes the opening portion which prescribes the opening angle of that sector, an ND filter portion 122a whose transmittance in the circumferential direction varies continuously is formed in a sectoral shape. Likewise, the aperture disc 120B is also formed with a sectoral opening portion 121b, and in the other edge portion which prescribes the opening angle of the sector, an ND filter portion 122b is formed in a sectoral shape. The angles $(\theta b - \theta a)/2$ of the sectors of the ND filter portions 122a and 122b are set equally to each other. Also, both of the two aperture discs 120A and 120B are rotation-adjustably provided and can steplessly adjust the opening angle $\theta a$ of the upper plane of the illumination Lmax of the illumination distribution in FIG. 9.

As another method of obtaining the illumination distribution of FIG. 9, utilization can be made of the reticle blind 10G shown in FIG. 3. That is, the straight blade edge proscribing the opening angle of the sectoral illuminating area IA is deviated on purpose in the direction of the optical axis AX from a plane conjugate with the reticle and the image of the edge is blurred, whereby it becomes possible to make an illumination gradient. However, if the straight blade edge is merely deviated in the direction of the optical axis, the blur width of the edge image will always become constant at any position in the diametrical direction of the sectoral illuminating area IA and the illumination distribution of FIG. 9 will not be obtained. So, the blade edge is disposed in a plane inclined with respect to a plane perpendicular to the optical axis so that the amount of deviation of the straight blade edge may become greater toward the outer periphery of the sector. If this is done, the blur width will become great near the outer periphery of the sector and become small near the inner periphery of the sector and therefore, an illumination distribution approximate to that of FIG. 9 will be obtained.

The exposure operation of the above-described embodiment of FIGS. 8-10 using the excimer laser is performed in the following manner. Assuming that the disc D is exposed by one full rotation thereof, by how many pulses of the excimer laser beam the disc is exposure during one full rotation thereof is first determined. For example, when the sum of the opening angle $\theta_a$ (FIG. 9) of the upper surface of the sectoral illuminating area IA and the angle $(\theta b - \theta a)/2$ of the illumination gradient portion is 20°, eighteen pulse oscillations can be effected during one full rotation (360° C.). Subsequently, the value of the sum of the pulse number output from the encoder EC2 during the rotation of the opening angle $\theta a$ and the pulse number output during the rotation of the angle $(\theta b - \theta a)/2$ is memorized by the data latch portion 108 of FIG. 8 and that value is loaded into the counter 107. Thereafter, when the rotations of the motors M1 and M2 reach the synchronous speed and the synchronization completion signal Sa changes from "0" to "1", the excimer laser 200 oscillates pulses each time the reticle and the disc are rotated by an angle $\theta a + (\theta b - \theta a)/2 = (\theta a + \theta b)/2$. When e.g. eighteen pulse oscillations are completed, exposure onto the full periphery of a disc D is terminated.

In an ordinary excimer laser, there is irregularity in the oscillation intensity of each pulse and therefore, in the exposure by one full rotation of the disc, the exposure amount may sometimes vary in each shot of the sector. So, the disc can be rotated two or greater integer times and pattern exposure can be effected a plurality of times in overlapping relationship. As an example, description will hereinafter be made of a case where the disc is exposed by two full rotations thereof.

The angle of the sector by the reticle blind 10G or the aperture disc 120A, 120B is set so that the angle $(\theta a + \theta b)/2$ of the timing of the generation of the trigger pulse Tg determined by the opening angles $\theta a$ and $\theta b$ of the illumination distribution of FIG. 9 may be 28.8°, and a pulse number corresponding to 28.8° is set in the data latch portion 108 of FIG. 8. Thereafter, when the motors M1 and M2 reach the synchronous speed, the trigger pulse Tg is generated at each rotation angle 28.8°, as previously described in connection with FIG. 8.

Figure 11:
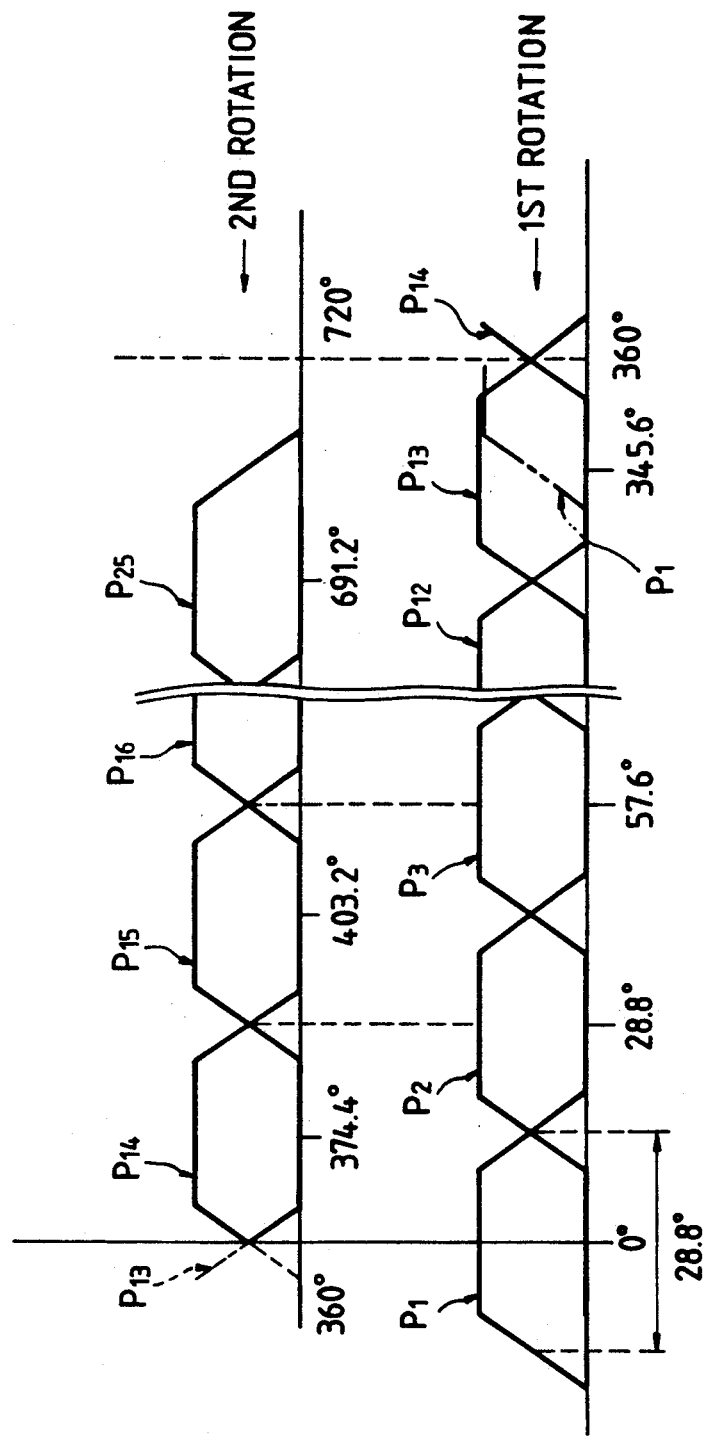
FIG. 11 is a graph showing the mode of rotation scan exposure by a pulse light source.

Here, the odd value of 28.8° has a great meaning. It is because this is a number into which the angle 720° corresponding to two full rotations of the disc D can be divided by an integer 25 and into which the angle 360° corresponding to one full rotation of the disc D cannot be divided by the integer. That is, if the pulse oscillation of the excimer laser light is effected at each 28.8° of the rotation of the disc, exposure corresponding to two full rotations is effected by just 25 pulse oscillations, and the overlapping portion between shot areas circumferentially adjacent to each other in the first full rotation can be made to appear at a different angular position in the second full rotation. This state is shown in FIG. 11. In FIG. 11, the horizontal axis represents the rotation angle position of the disc D, the lower stage shows the manner in which the exposure amount (illumination) with respect to the circumferential direction is given in the first full rotation, and the upper stage shows the manner in which the exposure amount with respect to the circumferential direction is given in the second full rotation First, the quantity-of-light distribution of the exposure shot by the first pulse oscillation is defined as P1, and the angular position at this time is defined 0°. Thereby, at the last of the first full rotation, the thirteenth pulse oscillation is effected at an angular position 345.6° (an angle smaller by 28.8°/2 than 360°). However, a part of the first distribution P1 in the first full rotation has already been given to the portion a quantity-of-light distribution P13 provides, and the exposure amount has partially increased at a point of time whereat the distribution P13 has been applied.

Further, when the second full rotation (360°-720°) is entered, pulse oscillation is effected at each 28.8° as indicated by distributions P14, P15, ..., and the distribution P25 of the last 25th pulse is applied at an angular position 691.2° (a position smaller by 28.8° than 720°). Thus, the 25th distribution P25 just overlap the inclined portion of the first distribution P1. Accordingly, the application of the exposure light is effected twice over the full periphery of the disc and moreover, the distribution of the exposure amount in the circumferential direction can be made uniform. Further, even if there is irregularity of intensity in each pulse of the excimer laser, the irregularity of the quantity of light as a whole is reduced by the averaging effect of the two exposures. Of course, the exposure at each point on the disc is effected twice and therefore, the illumination per pulse from the laser source may be ½ of that in the case of one full rotation.

Assuming that the optimum exposure amount onto the disc is 100 mJ and the illumination irregularity in each pulse of the excimer laser is ±5%, that amount of irregularity is intactly reflected during one full rotation exposure. That is, there is a probability that a difference of 10 mJ at the maximum will occur between the shots adjacent to each other in the circumferential direction. However, if the position at which the overlapping exposure between the adjacent shots appears during two full rotation exposure is staggered between the first full rotation and the second full rotation, the quantity-of-light distribution in the circumferential direction can be reduced to $10/\sqrt{2}$ mJ in terms of probability.

The method of staggering the position at which the linking portion appears in the overlapping of multiple times of exposure can also be applied to an aligner of the one-dimensional scan exposure type, i.e., the conventional one-dimensional scan exposure type. However, in the case of one-dimensional scanning, exposure is effected while a reticle and a photosensitive substrate are reciprocally moved.

The rotation scanning exposure of the disc has generally been described above, and description will now be made of an illuminating method for making the pattern line width of the projected image more minute, and the illuminating system. Generally, a disc of this type is made minute in the line width and pitch of round tracks arranged diametrically and is not made so minute in the size of information pits arranged circumferentially in the tracks. That is, a system in which the resolution of the projected image is excellent with respect to the diametrical direction of the original pattern area PA.

So, by assuming that the opening angle of the sectoral illuminating area IA on the reticle is not so great, considering the round track pattern of the pattern area PA existing in the area IA to be substantially one-dimensional grating-like pattern, and adopting an illuminating method of causing one of 1st-order diffracted lights from the grating-like pattern to interfere with 0-order light to thereby effect pattern imaging, an attempt is made to obtain resolution greater than the theoretical resolving power based on the conventional definition of the projection lens PL.

Figure 12A:
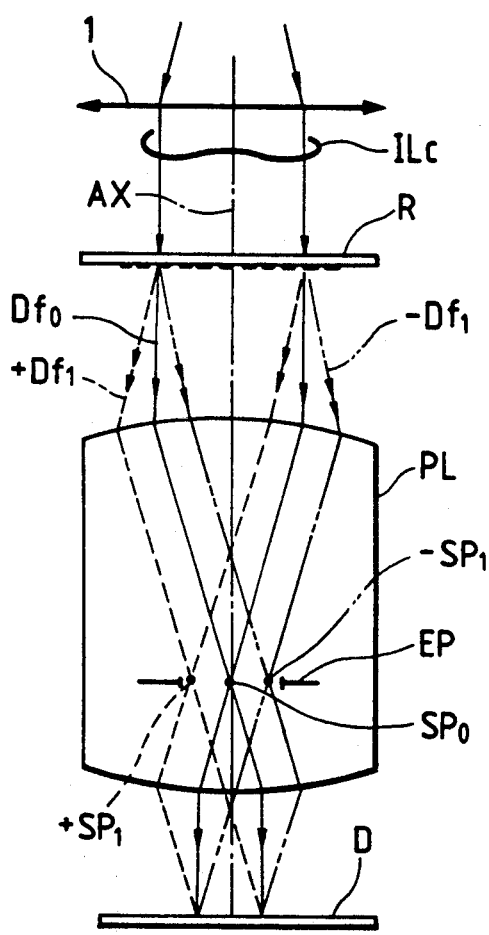
FIGS. 12A and 12B show the optical path in a projection system taking the diffraction of a reticle pattern into account.

The method and the principle of the construction of the illuminating system will hereinafter be described with reference to FIGS. 12A, 12B and 13. FIG. 12A schematically shows the behavior of the light beam during the pattern projection in the ordinary illuminating method shown in FIG. 3.

In FIG. 12A, the pattern of the round tracks on the reticle R is represented as a grating having a pitch in the left to right direction in the plane of the drawing sheet of this figure. Also, the projection lens PL is constructed as a both-side telecentric system, and in the exit pupil EP thereof, there are re-imaged a plurality of secondary light source images formed on the exit side of the fly-eye lens 10C shown in FIG. 3.

In FIG. 12A, there is shown a state in which a light beam ILc from a secondary light source image (a point source of light on the axis) lying on the optical axis AX of the fly-eye lens 10C is applied to the reticle. This light beam ILc is made into a light beam substantially parallel to the optical axis AX (a collimated light beam) by the condenser lens 1 and illuminates the pattern area of the reticle At this time, 0-order light $D_{f0}$ and besides, ±1st-order diffracted lights $+D_{f1}$ and $-D_{f1}$ spreading in the direction of the grating pitch are created from the pattern of the reticle. The +1st-order diffracted light $+D_{f1}$ enters the projection lens PL as a parallel light beam inclined leftwardly with respect to the 0-order light $D_{f0}$ as viewed in FIG. 12A, and the −1st-order diffracted light $-D_{f1}$ enters the projection lens PL as a parallel light beam inclined rightwardly with respect to the 0-order light $D_{f0}$ as viewed in FIG. 12A.

The 0-order light $D_{f0}$ (parallel light beam) enters the projection lens PL in parallelism to the optical axis AX. The 0-order light $D_{f0}$ is then condensed as a point light source image $SP_0$ at the center of the pupil EP of the projection lens PL (the position of the optical axis AX), whereafter it again becomes a parallel light beam and emerges from the projection lens PL and is applied to the disc D perpendicularly thereto On the other hand, the ±1st-order diffracted lights $D_{f1}$ are condensed as point images $+SP_1$ and $-SP_2$, respectively, at two locations which are point-symmetrical with the point light source image $SP_0$ in the pupil EP, whereafter they become parallel light beams intersecting each other while being symmetrically inclined on the disc D and are applied. If at this time, the reticle and the disc are in imaging relationship, a light intensity distribution (a contrast image) corresponding to the projected image of the grating-like pattern of the reticle is produced on the disc by the interference between the 0-order light $D_{f0}$ and the ±1st-order diffracted lights $D_{f1}$ (or higher-order diffracted lights)

In the ordinary principle of projection, it has been considered that good resolution is effected as long as the ±1st-order diffracted lights $D_{f1}$ pass through the effective diameter of the pupil EP of the projection lens PL and that resolution is impossible when the ±1st-order diffracted lights $D_{f1}$ are created from the reticle with such a degree of angle of diffraction that they cannot pass through the pupil EP. That is, when in FIG. 12A, the point images $\pm SP_1$ lie outside the effective diameter of the pupil EP, only the 0-order light $D_{f0}$ arrives at the disc D, but there is no diffracted light to interfere therewith and therefore, the production of image is not effected.

When the numerical aperture (N.A.) of the object (reticle) side of the projection lens PL which is primarily determined in conformity with the effective diameter of the pupil E is NAr and the angle of diffraction of the 1st-order diffracted lights $D_{f1}$ relative to the 0-order light $D_{f0}$ created by the reticle is $\psi_1$ and the pitch of the grating-like pattern on the reticle is Pgr and the wavelength of the illuminating light is λ, the pitch Pgr which satisfies the relation of the following expression is a resolvable reticle pattern.

MAr>λ/Pgr

When as an example, the wavelength is 0.365 μm (i line) and the numerical aperture NAd of the image (disc) side of the projection lens PL is 0.5 and the projection magnification m (in the case of reduction projection, $0 < m < 1$) is 0.2 (1/5 reduction), NAr is 0.1 from the relation that NAr$\approx$m·NAd and therefore, the pitch Pgr at the limit of resolution is about 3.65 $\mu$m from the previous expression. That is, resolving power of about 0.73 $\mu$m is theoretically obtained on the disc. Accordingly, when the pattern pitch Pgr on the reticle becomes smaller than 3.65 $\mu$m, resolution becomes impossible.

Figure 12B:
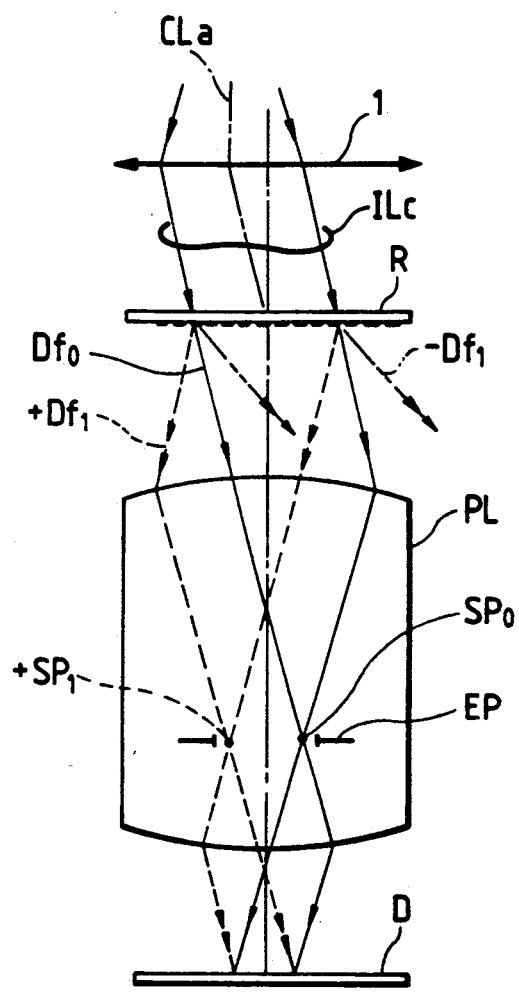

So, let it be assumed that as shown in FIG. 12B, the illuminating light beam ILc to the reticle is made to enter while being inclined with respect to the optical axis AX. The direction in which the light beam ILc is inclined is made uniform in the direction of the pitch of the reticle pattern and thus, in FIG. 12B, the light beam ILc is inclined in the plane of the drawing sheet. The central ray CLa of the light beam ILc is one which has come, for example, from a point source of light located off the axis of the fly-eye lens 10C of FIG. 3. In the case of FIG. 12B, the 0-order light $D_{f0}$ is condensed as a point image $SP_0$ at a location eccentric from the center of the pupil EP, and arrives as an inclined parallel light beam at the disc. On the other hand, the +1st-order diffracted light $+D_{f1}$ from the reticle pattern is created with an inclination symmetrical with respect to the 0-order light $D_{f0}$ and enters the projection lens PL, and is condensed as a point image $+SP_1$ on the pupil EP at a location point-symmetrical with the point image $SP_0$. The $-$1st-order diffracted light $-D_{f1}$ from the reticle pattern, even if it enters the projection lens PL, does not pass through the pupil EP but is intercepted. Accordingly, only the +1st-order diffracted light $+D_{f1}$ arrives at the disc as a parallel light beam of an inclination symmetrical with the 0-order light $D_{f0}$. Thereby, on the disc, imaging is accomplished by the interference between the 0-order light $D_{f0}$ and the +1st-order diffracted light $+D_{f1}$.

As is apparent from FIG. 12B, if the 0-order light $D_{f0}$ from the reticle pattern is inclined with respect to the optical axis AX, the angle of diffraction of the +1st-order diffracted light $D_{f1}$ can in principle be enlarged to about double as compared with the case of FIG. 12A. Therefore, the pitch Pgr of the resolvable reticle pattern is expressed by the relation of the following expression:

$$2\text{NAr} \geq \lambda/\text{Pgr}$$

From this, the pitch of the reticle pattern at the limit of resolution becomes about 1.83 $\mu$m in the case of the previous example of the numerical values, and is about 0.37 $\mu$m on the disc.

Also, the inclination of the illuminating light beam ILc (the inclination of the central ray CLa in the image space with respect to the optical axis AX) is set to about a half of the angle of diffraction of the 1st-order diffracted lights corresponding to the pitch of the reticle pattern. If this is done, the point images $SP_0$ and $+SP_1$ are located point-symmetrically in the pupil EP (also called Fourier transformation plane) and the quality of the projected image of the reticle pattern becomes best. However, when this is intactly adopted in the apparatus, the intensities of the +1st-order diffracted light and 0-order light do not coincide with each other and therefore, contrast is 90.6% at greatest. Also, deviation occurs to telecentricity and the imaging position may differ due to a little defocus.

So, another illuminating light beam is applied to the reticle R at an angle of incidence symmetrical with the illuminating light beam ILc shown in FIG. 12B. In that case, of 0-order light and $-$1st-order diffracted light created from the reticle pattern by said another illuminating light beam, the 0-order light passes along the same optical path as the +1st-order diffracted light $+D_{f1}$ in FIG. 12B and the $-$1st-order diffracted light passes along the same optical path as the 0-order light $D_{f0}$ in FIG. 12B.

As described above, if the illuminating method is made special, the resolving power can be enhanced even when the same projection lens as a conventional one is used. At the same time, it is also possible to enlarge the depth of focus In an actual apparatus, however, it is difficult to enhance the resolving power to about double as in the above-described example of the numerical values, and realistically the enhancement of the resolving power would be up to about 1.5 times.

Figure 13:
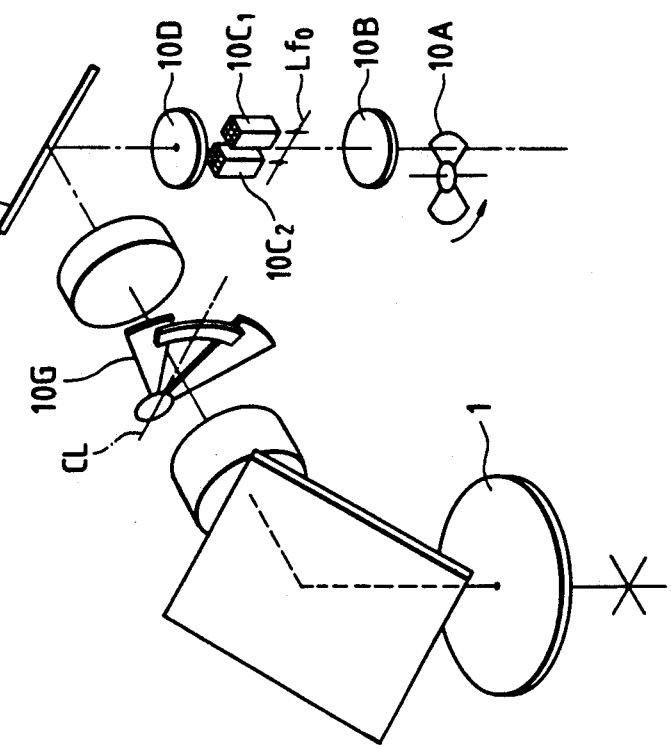
FIG. 13 is a perspective view showing an example of an illuminating optical system suitable for the adoption of a special illuminating method.

FIG. 13 shows an embodiment of the apparatus when the principle of projection described with reference to FIG. 12B is realized, and this apparatus premises the illuminating optical system of FIG. 3. In this embodiment, design is made such that when a plane containing the center line CL of the sectoral illuminating areas IA1 and IA2 shown in FIG. 4 and the optical axis AX is supposed, the reticle R is illuminated by two illuminating light beams inclined symmetrically in this plane with respect to the optical axis AX.

Therefore, as shown in FIG. 13, the fly-eye lens 10C in FIG. 3 is divided into two groups 10C1 and 10C2, and a segment $L_{f0}$ linking the center of the fly-eye lens 10C1 and the center of the fly-eye lens 10C2 together is set parallel to the center line CL of the sectoral illuminating area IA. These fly-eye lenses 10C1 and 10C2 each comprise a number of element lenses of smaller cross-sectional dimensions than in the prior art bundled, and by changing the center spacing on the segment $L_{f0}$, the angle of intersection between the central rays of two illuminating light beams arriving at the reticle can be adjusted.

The size of each of the exit ends of the fly-eye lens 10C1 and 10C2 is set so that in the pupil EP of the projection lens PL, $\sigma$ value may be of the order of 0.1–0.3. If another set of fly-eye lens similar to the set of fly-eye lens 10C1 and 10C2 is prepared and these two sets are symmetrically disposed with the segment $L_{f0}$ interposed therebetween, the resolution in the circumferential direction on the disc, i.e., the resolving power in the direction of arrangement of the pit rows, can also be enhanced.

As described above, simply by changing the construction of the illuminating system as in the present embodiment, grooves or pits of sufficiently minute line width can be formed on the disc. As another technique of achieving the minuteness of the line width, it is also conceivable to use a phase shift reticle. The principle of the projection exposure by such phase shift reticle is disclosed, for example, in Japanese Patent Publication No. 62-50811, and therefore need not be disclosed in detail herein.

The construction and operation of the disc exposure apparatus according to the embodiment of the present invention have been described above, and in the scanning type exposure system of this kind, the rotational speed of the reticle and the rotational speed of the disc must be very stable at least during the exposure operation, because if any slight difference occurs between the rotational speeds of the two, the transferred pattern image in that portion will expand or contract in the circumferential direction in conformity with the speed difference.

Figure 14:
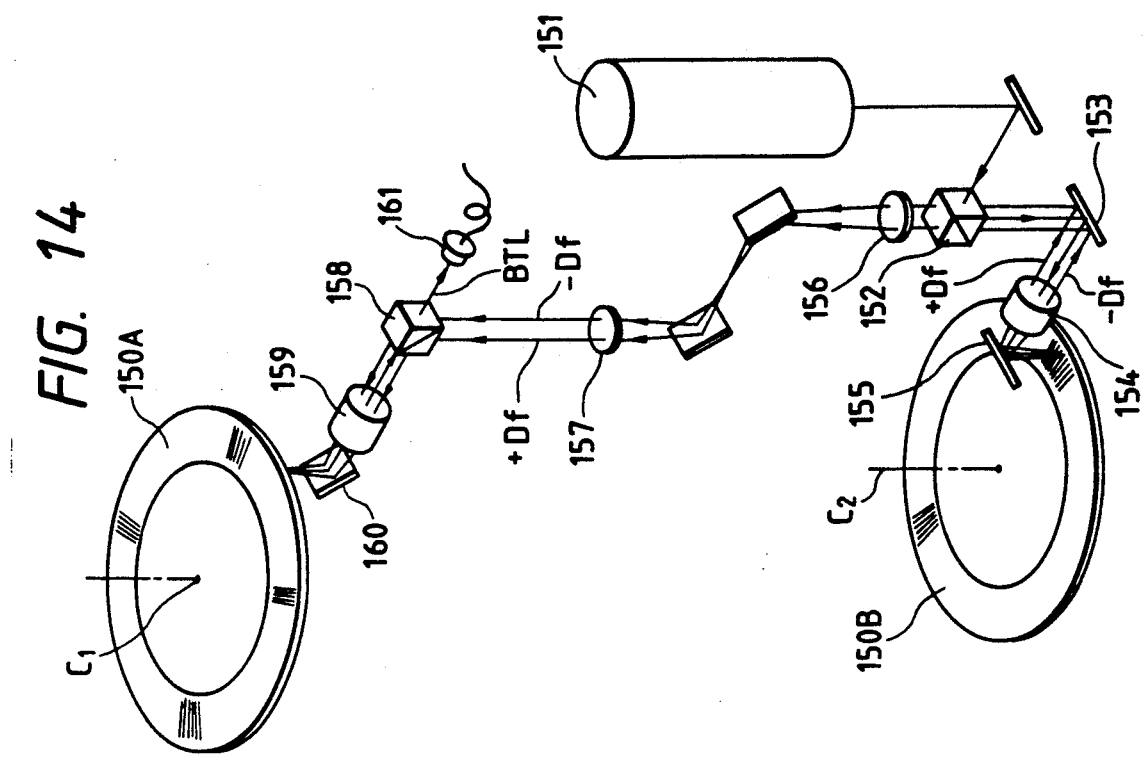
FIG. 14 is a perspective view showing the construction of a measuring system for detecting the deviation of rotational speed.

So, a system for detecting the rotational speed difference highly accurately becomes necessary. In FIG. 5, it has been described to use the encoders EC1 and EC2 of high resolving power for that purpose, but a detecting system much higher in resolving power than ordinary encoders will hereinafter be described. The basic technique of this detecting system is called the light interference method whereby coherent laser beams are projected from two directions onto a diffraction grating moved in the direction of pitch, the variation in the intensity of interference light created perpendicularly from the diffraction grating is photoelectrically detected and the phase change of the signal is detected A specific construction will hereinafter be described. FIG. 14 schematically shows a system for detecting the difference between the relative rotational speeds of incremental type encoder discs 150A and 150B fixed coaxially with the rotary shaft of a reticle R and the rotary shaft of a turn table 30, respectively On each of the encoder discs 150A and 150B, gratings radially extending on the circumference thereof are formed at a predetermined pitch in the circumferential direction. These gratings may be phase gratings suitable for the reflection type In FIG. 14, a beam from a laser source (gas or a semiconductor or the like) 151 is partly reflected by a beam splitter 152 and travels along the optical axis of an objective lens 154 via a mirror 153. Although not shown in FIG. 14, the beam emitted from the laser source 151 enters the beam splitter 152 through a beam expander and a lens system and is condensed so as to become a beam waist in the front focal plane of the objective lens 154. Accordingly, the beam emerging from the objective lens 154 along the optical axis thereof becomes a parallel light beam (a collimated light beam), is reflected by a mirror 155 and is projected onto the gratings of the encoder disc 150 perpendicularly thereto. Thereby, diffracted lights $+D_f (\pm$1-st-order, $\pm$2nd-order, $\pm$3rd-order, etc.) spreading in the direction of pitch are created from the gratings, and they arrive at the grating portion of the encoder disc 150A for the reticle via the objective lens 154, the mirror 153, the beam splitter 152, lens systems 156, 157, a beam splitter 158, an objective lens 159 and a mirror 160 In order to enhance the detection resolving power, a spatial filter is provided at a position which provides a Fourier transformation plane in the optical path from the objective lens 154 to the lens system 156 or the optical path from the lens system 157 to the objective lens 159, so that $\pm$3rd-order diffracted lights (n=3) may be extracted as diffracted lights $+D_{fn}$ (n being the order number). These two diffracted lights $\pm D_{fn}$ are projected onto the grating portion of the encoder disc 150A at an angle of incidence symmetrical with the direction of pitch and therefore, on the grating portion, interference fringes are produced by the two obliquely incident diffracted lights $\pm D_{fn}$. Re-diffracted light created in the vertical direction by the application of the diffracted lights $\pm D_{fn}$ and re-diffracted light created in the vertical direction by the application of the diffracted light $-D_{fn}$ become coaxial with each other and create an interference beam BTL. This interference beam BTL travels along the optical axis via the mirror 160, the objective lens 159 and the beam splitter 158 and is received by a photoelectric element 161.

In the above-described construction, when the peripheral velocity of the grating portion of the encoder disc 150B for the disc is $V_1$, the two diffracted lights $+D_{fn}$ and $-D_{fn}$ become different in frequency from each other due to the doppler effect For example, when the frequency of the beam from the laser source 151 is $f_0$, the frequency $f_1$ of the diffracted light $+D_{fn}$ becomes $f_0+\Delta F\times n$ and the frequency $f_2$ of the diffracted light $-D_{fn}$ becomes $f_0-\Delta F\times n$. $\Delta F$ is the number of gratings which cross the laser beam per second. Thus, the interference fringes produced on the grating portion of the encoder disc 150A for the reticle flow in the direction of pitch due to the frequency difference 2·n$\Delta$F between the two diffracted lights $\pm D_f$. The speed at which the interference fringes flow primarily corresponds to the rotational speed of the encoder disc 150B. So, if the direction in which the interference fringes flow and the direction in which the grating portion of the encoder disc 150A moves are made identical to each other, when the encoder discs 150A and 150B are at the same angular velocity, the interference beam BTL arriving at the photoelectric element 161 keeps a constant intensity (a direct-current-like level), and when a difference occurs between the angular velocities, the interference beam varies its intensity in a sine-like form at a frequency conforming to the amount of the difference.

However, if so, it is difficult to apply phase measurement to the detection of any slight angular velocity difference and therefore, the optical system is designed such that the direction of movement of the grating portion of the encoder disc 150A and the direction in which the interference fringes flow become opposite to each other. If this is done, when the difference between the relative angular velocities of the two encoder discs 150A and 150B is zero, the output from the photoelectric element 161 becomes an AC signal (sine-wave-like) of a predetermined frequency (reference frequency), and when a difference occurs between the relative angular velocities, said output becomes an AC signal of a frequency deviated from the reference frequency 4·n·$\Delta F$=12·$\Delta$FHz). Accordingly, the frequency (phase) of the output signal from the photoelectric element 161 is compared with the reference frequency (reference phase) on real time, and the phase difference therebetween is detected, whereby the difference between the rotational speeds of the reticle and the disc can be continuously found. Since the two diffracted lights $\pm D_{fn}$ are also projected onto the moving grating portion of the encoder disc 150A, the interference beam BTL also becomes subjected to the doppler effect conforming to the rotational speed of the encoder disc 150A.

As described above, it will suffice if use can be made of a speed sensor of high accuracy and high resolving power, but if use cannot be made of such speed sensor, the inertia (moment of inertia) of the rotative driving system for the reticle and the rotative driving system for the disc (the table 30, etc.) is made great and friction is minimized by the adoption of an air bearing, an air float (or magnefloat) bearing or the like, whereby the synchronizing speed can be maintained relatively easily.

Figure 15A:
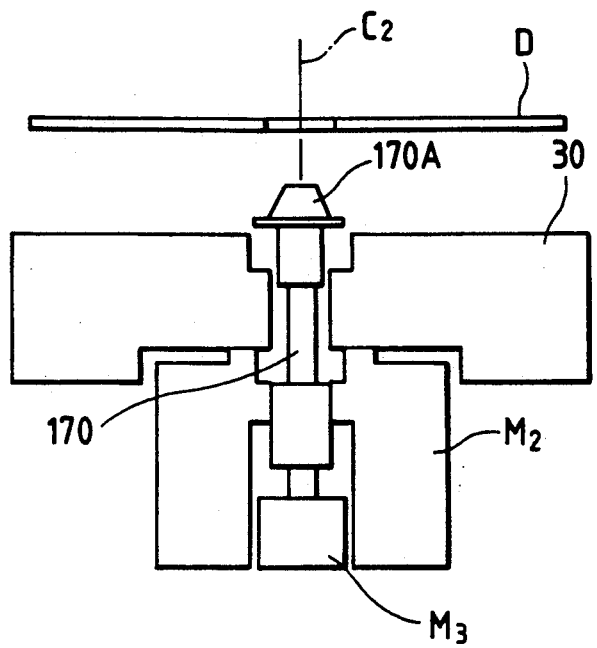
FIGS. 15A and 15B show the structure of a table suitable for the conversion of a disc.
Figure 15B:
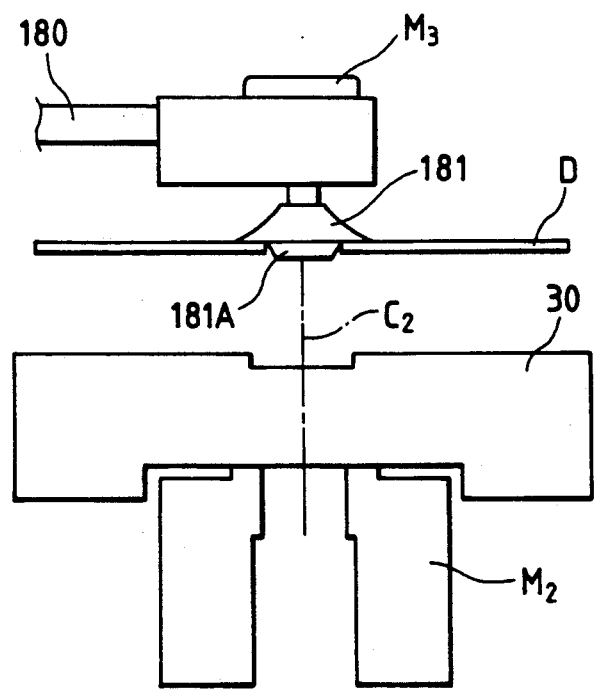

Now, several tens (or several hundreds) of discs must be continuously exposed and therefore, each time a disc is exposed, the interchanging work is necessary. That is, the rotation of the turn table 30 of great inertia must be stopped and an exposed disc must be removed, whereafter a new disc must be placed on the turn table 30 and the turn table 30 must be driven to a constant speed rotation range. However, the stoppage of rotation of the turn table of such great inertia and the starting of such turn table to constant speed rotation require a considerable time, and this becomes a factor which aggravates the throughput in the manufacture of discs. So, if the structure of the turn table 30 is made such as shown in FIGS. 15A and 15B, the throughput can be markedly improved FIG. 15A shows the cross-sections of a motor M2 for rotating the turn table 30 and a motor M3 for rotating a center-up 170. A frustoconical cap 170A engageable with the center hole of the disc D is provided on the upper end of the center-up 170, and the centering of the disc is effected by this cap 170A. Also, the cap 170A is provided for vertical movement rotative to the supporting surface of the turn table 30 and is rotated by the motor M3. In such a construction, the cap 170A and the turn table 30 are individually rotatable and therefore, the turn table 30 of great inertia is normally rotated at a constant speed, and during the interchange of the disc, the rotation of the motor M3 is started and stopped and the center-up 170 is vertically moved to thereby effect quick interchanging work.

To unload the disc D on the turn table 30, the cap 170A of the center-up 170 is first projected upwardly while the motor M3 is rotated substantially at the same speed as the turn table 30. At the same time, the adsorbing operation of the supporting surface of the turn table 30 is changed over to air flow or the like. Thereupon, the cap 170A comes into engagement with the central hole of the disc D and further, raises the disc by a predetermined amount from the supporting surface of the turn table 30. Thereafter, the motor M3 is suddenly stopped by a dynamic brake (regenerative braking) or the like, and then the disc is unloaded from the cap 170A by a converying arm or the like. As can be seen from FIGS. 15A and 15B, the inertia of the center-up including the disc on the cap 170A is very small as that of the turn table 30 and therefore, the time required for the sudden stoppage or the time until the constant speed range after the starting is reached is markedly short.

To load a new disc onto the turn table, the central hole of the disc is brought into engagement with the cap 170A while the motor M3 is kept stopped in the state of FIG. 15A. The motor M3 is then started to increase the angular speed of the cap 170A and the disc to an angular speed substantially equal to that of the turn table 30. The time required for this is only one to two seconds. Thereafter, when the center-up is lowered, the cap 170A gets under the supporting surface of the turn table 30 and the disc is delivered onto the turn table 30.

With the above-described construction, the stoppage and starting of the turn table 30 become unnecessary and therefore, the interchange time becomes very short. Further, the disc is preliminarily rotated by the motor M3 for the center-up so as to assume the same speed as the turn table 30 and therefore, the friction between the back of the disc and the supporting surface of the turn table 30 becomes null and thus, the creation of any flaw can be prevented.

In FIG. 15A, the cap 170A is forcibly rotated by the motor M3, but if a friction clutch or the like is provided between the motor M2 or the turn table 30 and the cap 170A, the motor M3 will be unnecessary. In that case, however, the fluctuation of the speed of the turn table 30 will be caused by the ON-OFF of the friction clutch and therefore, some time will be required until the synchronizing speed is maintained stable after the interchanging work.

FIG. 15B shows a modification of the rotational type disc interchanging mechanism. In FIG. 15B, the motor M3 is fixed to the tip end portion of a disc conveying arm 180, and a downwardly facing adsorbing cup 181 is mounted on the shaft of this motor. The adsorbing cup 181 has a centering projection 181A engageable with the central hole of the disc D, and adsorbs the upper surface side of the disc D. In the interchange of the disc, the motor M3 is rotated and when the disc assumes the same speed as the turn table 30, the arm 180 is lowered to thereby deliver the disc onto the turn table 30, and the adsorption by the adsorbing cup 181 is stopped and at the same time, the adsorption of the table 30 side is started. Thereafter, the arm 180 can be moved up and the rotation of the motor M3 can be stopped.

In the case of FIG. 15B, if the positioning accuracy of the arm 180 is bad, great eccentricity will occur to the disc delivered onto the turn table 30. So, in order to make the center of rotation C2 of the turn table 30 and the center of rotation of the motor M3 (the center of the disc) coincident with each other, a semiconductor laser and a small lens are incorporated in the center of the adsorbing cup 181, and provision is made of a construction for projecting the laser spot of the semiconductor laser toward the turn table 30 perpendicularly thereto. Further, the positions of the laser spot and the arm 180 may be aligned with the center C1 of the turn table 30.

As described above, in each embodiment of the present invention, the rotative driving of the reticle and the rotative driving of the disc are done so as to electrically obtain a synchronizing speed by the use of discrete motors, but alternatively, a single motor may be used and a mechanical system in which the reticle and the disc are fixed to the opposite ends of the shaft of that motor may be adopted. In such case, the center of rotation C1 of the reticle and the center of rotation C2 of the disc become coaxial with each other and therefore, a mirror for bending the optical path of the projection optical system becomes necessary. Also, in that case, the directions of rotation of the reticle and the disc become identical to each other as a matter of course because the driving thereof is by one and the same rotating shaft.

What is claimed is:

1. An apparatus for manufacturing a disc medium formed with concentric or spiral round tracks at a predetermined pitch in the diametrical direction thereof comprising:

a projection optical system;

first rotatably holding means for rotatably holding a mask substrate formed with a zonal original pattern corresponding to said round tracks in the object plane of said projection optical system with the central point of the zone of said original pattern substantially as the origin;

illuminating means for irradiating a portion of said original pattern with illuminating light limited to a slit-like shape or a sectoral shape having substantially the same degree of length as the radial width of said zone and extending in the diametrical direction of said zone;

second rotatable holding means for holding the central point of a photosensitive disc at a position substantially conjugate with the central point of the zone of said mask substrate with respect to said projection optical system, and rotating said photosensitive disc with the central point thereof as the origin;

drive control means for rotatively driving said first and second rotatable holding means so that said mask substrate and said photosensitive disc may be synchronously rotated at substantially equal angular velocities; and means for controlling said illuminating means so that said mask substrate may be irradiated as long as said mask substrate and said photosensitive disc are rotated substantially integer times.

* * * * *